(12) United States Patent
Keeth et al.

(10) Patent No.: US 6,522,172 B2
(45) Date of Patent: Feb. 18, 2003

(54) HIGH SPEED LATCH/REGISTER

(75) Inventors: Brent Keeth, Boise, ID (US); Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/812,757

(22) Filed: Mar. 20, 2001

(65) Prior Publication Data

US 2002/0136063 A1 Sep. 26, 2002

(51) Int. Cl.$^7$ .............................................. H03K 19/03
(52) U.S. Cl. .............................. 326/95; 326/98; 326/93; 365/203; 365/189.05
(58) Field of Search .............................. 326/93, 95, 98; 365/203, 189.05; 327/208–212, 214, 215, 224, 225

(56) References Cited

U.S. PATENT DOCUMENTS

| | | | |
|---|---|---|---|
| 5,623,645 A | | 4/1997 | Yip et al. |
| 5,649,175 A | | 7/1997 | Kanekal et al. |
| 5,831,453 A | * | 11/1998 | Stamoulis et al. .......... 326/113 |
| 5,859,547 A | * | 1/1999 | Tran et al. ..................... 326/98 |
| 5,910,920 A | | 6/1999 | Keeth |
| 6,081,130 A | * | 6/2000 | Cao et al. ...................... 326/55 |
| 6,104,212 A | | 8/2000 | Curran |
| 6,111,446 A | | 8/2000 | Keeth |

* cited by examiner

*Primary Examiner*—Michael Tokar
*Assistant Examiner*—Vibol Tan
(74) *Attorney, Agent, or Firm*—Thorp Beed & Armstrong, LLP

(57) ABSTRACT

A circuit having a data input pin for receiving a data signal, a clock input for receiving a clock signal and having a low setup time and a zero hold time is comprised of an input stage for periodically connecting a sampling device to the data input pin in response to the clock signal. An evaluation stage, responsive to the clock signal, evaluates the charge collected by the device at a time the device is disconnected from the data input pin. The evaluation stage produces a signal representative of the sampled charge. An output stage, responsive to the clock signal and the produced signal, outputs a data signal representative of the sampled data signal. The circuit may have a single data path and a single charge accumulating device such that an output signal representative of the sampled data signal is available on either the rising or the falling edge of the clock signal. Alternatively, multiple data paths may be provided as well as multiple charge accumulating devices so that data signals representative of the sampled data may be output on both the rising and the falling edge of the clock signal. The circuit can be operated as either a latch or a register. A method of operating a data acquisition and retention circuit having a zero hold time and of the type useful for receiving signals from a high speed bus is also disclosed.

38 Claims, 6 Drawing Sheets

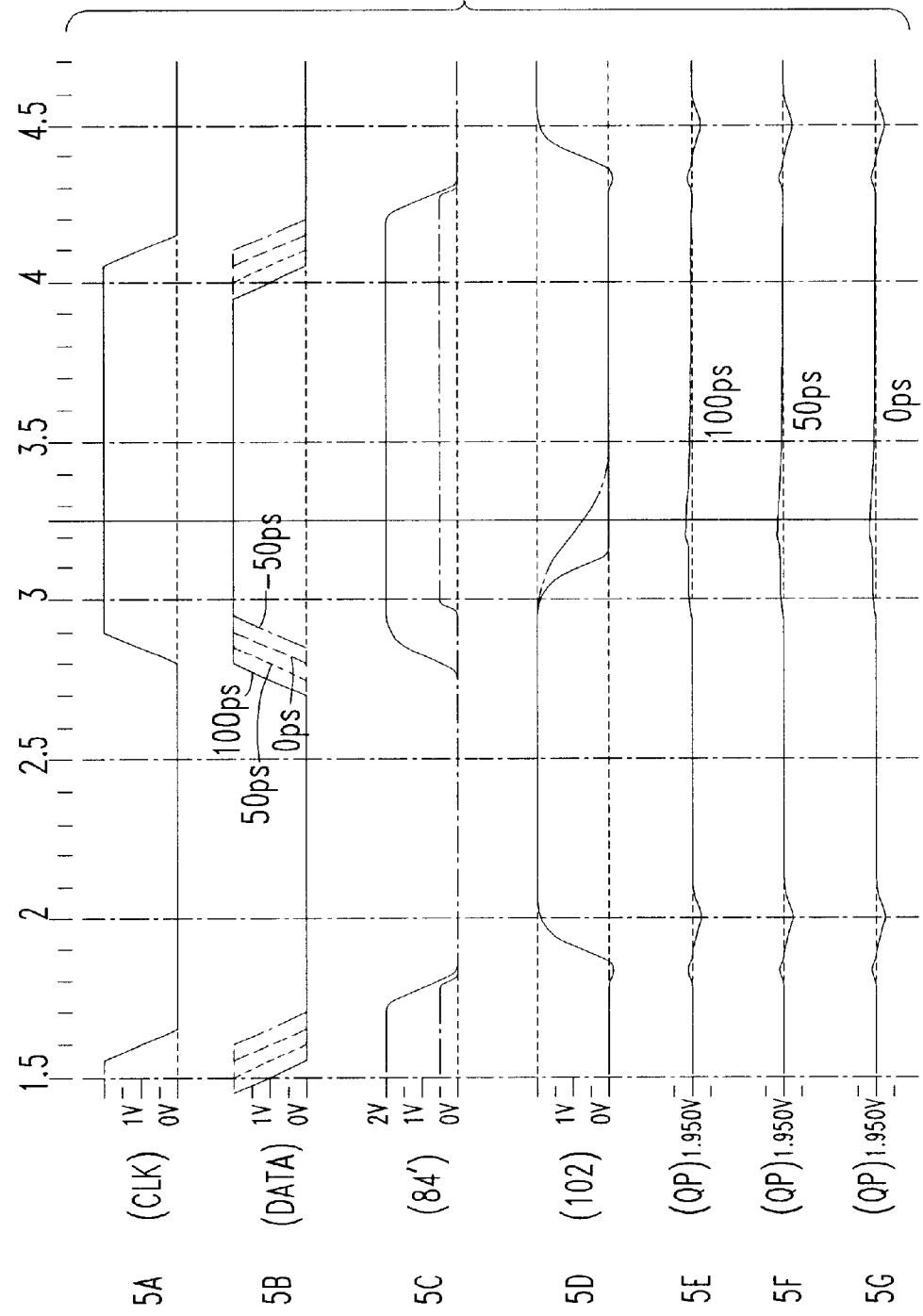

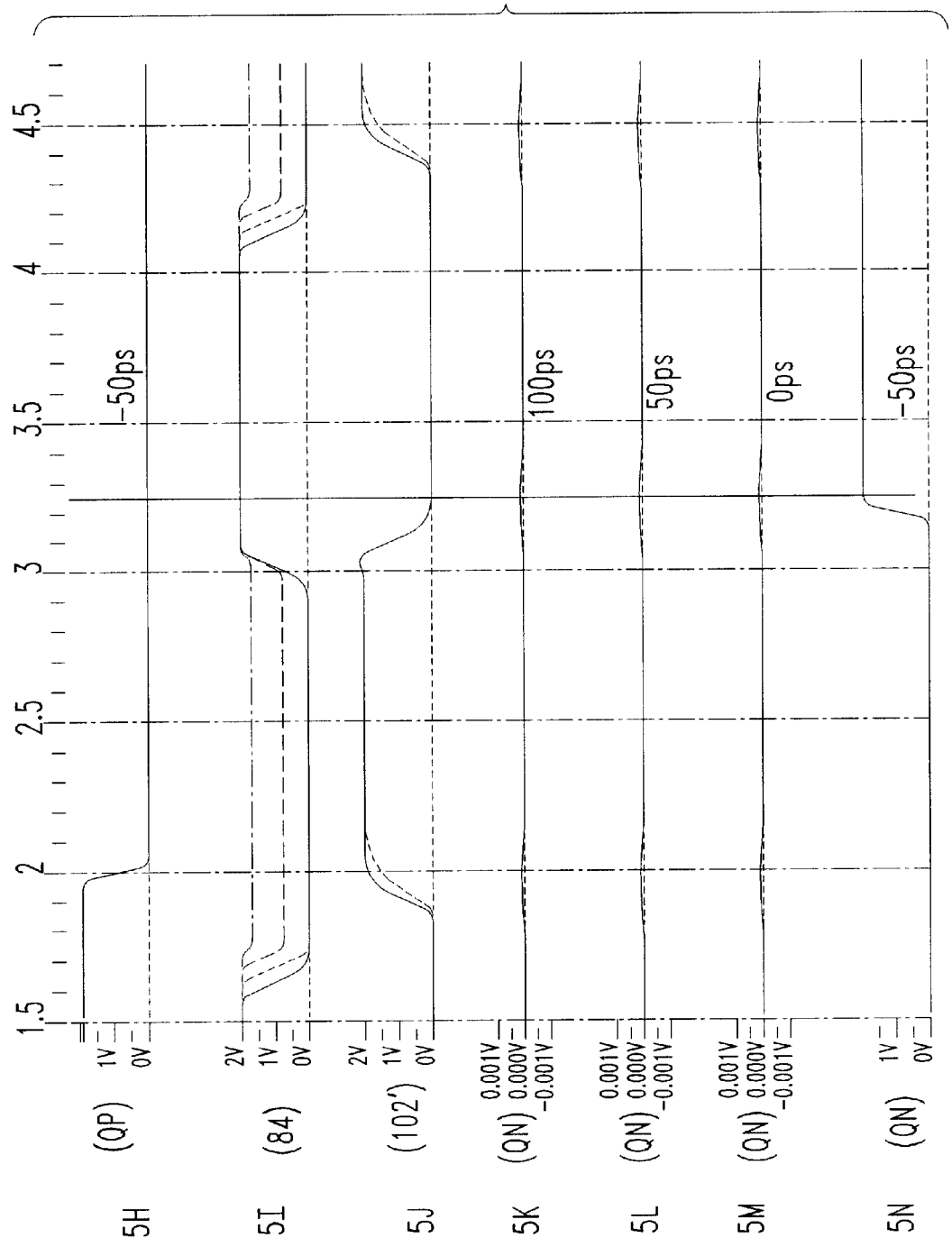

HIGH SPEED LATCH/REGISTER

BACKGROUND OF THE INVENTION

1. Field of the Invention

The present invention is directed to integrated circuits and, more particuarly, to input circuits used in combination with high speed busses.

2. Description of the Background

Communication busses have been developed which can transmit signals between circuitry at a rate that is faster than the capacity of many integrated circuits. Thus, the data transmission rate of modern systems comprised of integrated circuits is primarily limited by internal circuitry operating speeds. To address the need for faster circuits, a group of integrated circuits can be combined on a common bus. In that configuration, each integrated circuit operates in a coordinated manner with the other integrated circuits to share data which is transmitted at a high speed. For example, a group of memory devices, such as random access memories (RAMs), dynamic random access memories (DRAMs), or read only memories (ROM), can be connected to a common data bus. The bandwidth of the bus is typically greater than the bandwidth of an individual memory device due to the operation of memory devices in parallel. Each memory device, therefore, is operated so that while one memory is processing received data, another memory is receiving new data. By providing an appropriate number of memory devices and an efficient control system, very high speed data transmissions can be achieved.

As the transmission rate of high speed busses continues to increase, more stringent operating parameters are imposed on the integrated circuits, such as memory devices, connected thereto. The specification for a high speed bus typically identifies a required "setup" time and "hold" time. The setup time is the time allotted, prior to a clock edge used to capture information related to a bus transaction (i.e., command, address, and data), for the information to arrive at a destination. The ADT Bus Specification, for example, allows a setup time on the order of 200 to 250 pico-seconds from the time data (e.g., address, data, command, etc.) is valid before the next clock transition. Once bus transaction information is made available, the ADT Bus Specification allows for a hold time on the order of 200 to 250 pico-seconds. The failure to meet the setup time and hold time requirements may lead to the capturing of invalid bus transaction information. Although there are numerous latch and register circuits used to receive and hold data, the need exits for improved circuits capable of meeting the low setup time and hold time requirements.

SUMMARY OF THE PRESENT INVENTION

The present invention is directed to a circuit having a data input pin for receiving a data signal, a clock input pin for receiving a clock signal and having a low setup time and a zero hold time. The circuit is comprised of an input stage for periodically connecting a sampling device to the data input pin in response to the clock signal. An evaluation stage, responsive to the clock signal, evaluates the charge collected by the sampling device at a time the device is disconnected from the data input pin. The evaluation stage produces a signal representative of the sampled charge. An output stage, responsive to the clock signal and the produced signal, outputs a data signal representative of the sampled charge, i.e., the sampled data signal. The circuit may have a single data path and a single charge accumulating device such that an output signal representative of the sampled data signal is available on either the rising or the falling edge of the clock signal. Alternatively, multiple data paths may be provided as well as multiple charge accumulating devices so that data signals representative of the sampled data may be output on both the rising and the falling edge of the clock signal. Various types of components may be implemented in the design such that the circuit can be operated as either a latch or a register. The circuit of the present invention may be used as a command or data latch in, for example, various memory devices connected to a high speed system bus.

The present invention is also directed to a method of operating a data acquisition and retention circuit having a low setup time and a zero hold time and of the type useful for receiving signals from a high speed bus. The method is comprised of the steps of connecting a charge accumulating device to a source of data signals in response to an edge of a clock signal. The charge accumulating device is isolated from the source of data signals in response to another edge of the clock signal. The accumulated charge is evaluated at the time when the device is isolated from the source of data signals. A logic signal, i.e. data signal, is output based on the evaluating step. The connecting and isolating steps may each last for approximately one half of the cycle of the clock signal, or approximately one nano-second.

The circuit disclosed herein may be implemented as a latch or register that has a very low setup time (less than 50 ps) and zero hold time. That level of performance is achieved in several ways. First, the clock and data paths are carefully matched in terms of topology, loading and delay. Second, the amount of charge required to setup the data state is kept very low. Third, the data path is isolated prior to the pre-charge and evaluate latch firing to eliminate any hold time requirements. The combination of those features, and others, allows the present invention to achieve very low setup and zero hold time performance. Because the circuit of the present invention has such a low setup time and requires zero hold time, the 200–250 pico-second system performance time can be used by other parts of the device in which the circuit of the present invention may be employed. Those, and other advantages and benefits, will be apparent from the Description of the Preferred Embodiment appearing hereinbelow.

BRIEF DESCRIPTION OF THE DRAWINGS

For the present invention to be easily understood and readily practiced, the present invention will now be described, for purposes of illustration and not limitation, in conjunction with the following figures, wherein:

FIGS. 5–1 and 5–2 show 5A through 5N which are signal traces which help to explain the operation of the register of FIG. 4.

DESCRIPTION OF THE PREFERRED EMBODIMENTS

Figure 1:
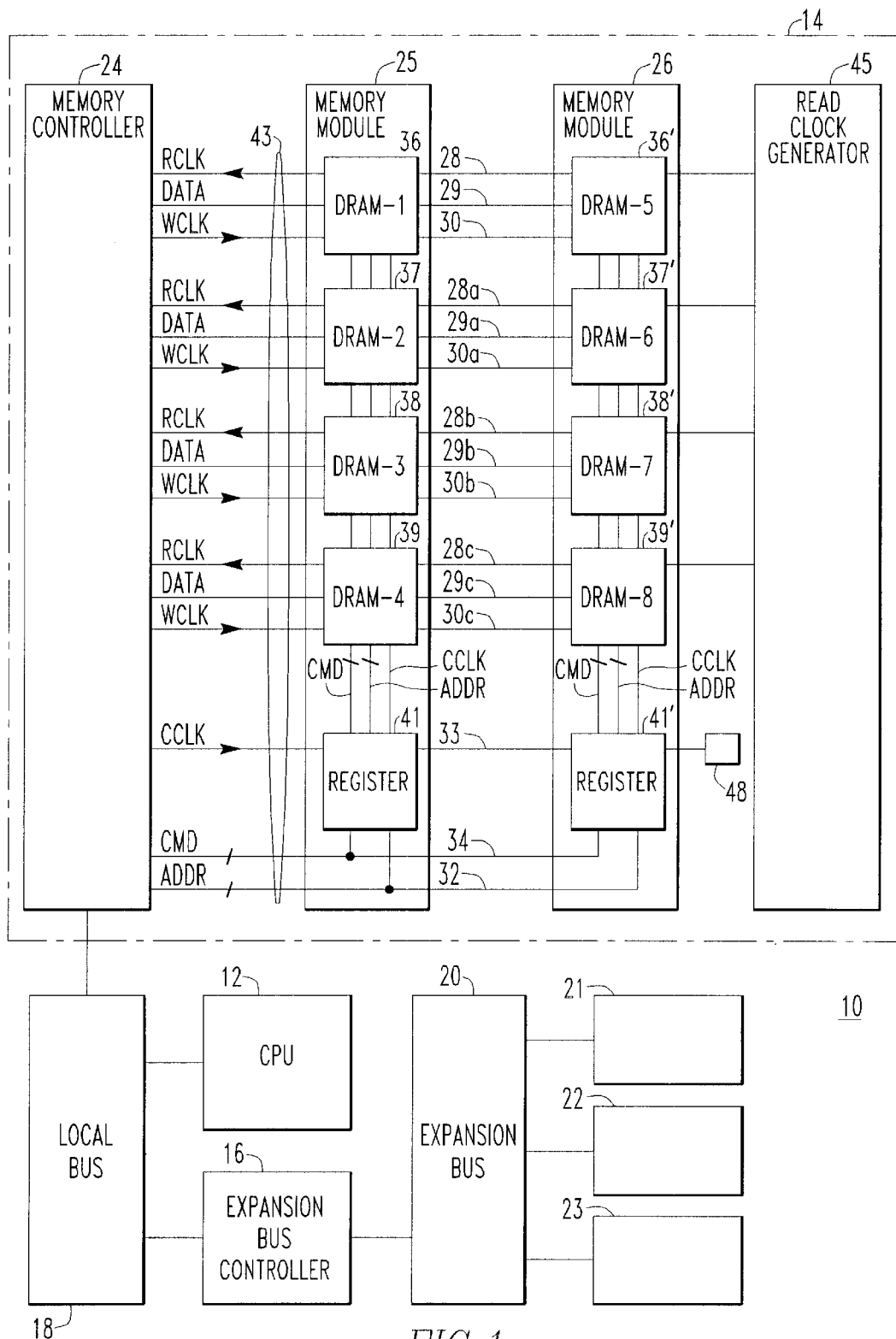
FIG. 1 is a block diagram of a system in which a high speed bus is used to interconnect memory modules.

FIG. 1 is a block diagram of a computer system 10. The computer system 10 includes a processor 12, a memory subsystem 14, and an expansion bus controller 16. The memory subsystem 14 and the expansion bus controller 16 are coupled to the processor 12 via a local bus 18. The expansion bus controller 16 is also coupled to at least one expansion bus 20, to which various peripheral devices 21–23 such as mass storage devices, keyboard, mouse, graphic adapters, and multimedia adapters may be attached. Processor 12 and memory subsystem 14 may be integrated on a single chip.

The memory subsystem 14 includes a memory controller 24 which is coupled to a plurality of memory modules 25, 26 via a plurality of signal lines 28, 29, 30, 28a, 29a, 30a, 28b, 29b, 30b, 28c, 29c and 30c. The plurality of data signal lines 29, 29a, 29b, 29c are used by the memory controller 24 and the memory modules 25, 26 to exchange data DATA. Addresses ADDR are signaled over a plurality of address signal lines 32, command clock signals CCLK are applied on a clock line 33, and commands CMD are signaled over a plurality of command signal lines 34. The memory modules 25, 26 include a plurality of memory devices 36–39, 36'–39' and a register 41, 41', respectively. Each memory device 36–39, 36'–39' may be a high speed synchronous memory device. Although only two memory modules 25,26 and associated signal lines 28–28c, 29–29c, 30–30c are shown in FIG. 1, it should be noted that any number of memory modules can be used.

The plurality of signal lines 28–28c, 29–29c, 30–30c, 32, 33, 34 which couple the memory modules 25, 26 to the memory controller 24 are known as the memory bus 43. The memory bus 43 may have additional signal lines which are well known in the art, for example chip select lines, which are not illustrated for simplicity. Each column of memory devices 36–39, 36'–39' which spans the memory bus 43 is known as a rank of memory. Generally, single side memory modules, e.g. SIMMs (Single Sided In-Line Memory Modules) such as the ones illustrated in FIG. 1, contain a single rank of memory. However, double sided memory modules, e.g. DIMMs (Dual In-Line Memory Modules) containing two ranks of memory may also be used.

Read data is output serially synchronized to the read clock signal RCLK, which is driven across a plurality of read clock signal lines, 28, 28a, 28b, 28c. The read clock signal is generated by a read clock generator 45 and driven across the memory devices 36–39, 36'–39' of the memory modules 25, 26, respectively, to the memory controller 24. Write data is input serially synchronized to the write clock signal WCLK, which is driven across a plurality of write clock signal lines 30, 30a, 30b, 30c by the memory controller 24. Commands and addresses are clocked using the command clock signal CCLK which is driven by the memory controller 24 across the registers 41, 41' of the memory modules 25, 26, respectively, to a terminator 48. The command, address, and command clock signal lines 34, 32, 33, respectively are directly coupled to the registers 41, 41 ' of the memory modules 25, 26, respectively. The registers 41, 41' buffer those signals before they are distributed to the memory devices 36–39, 36'–39' of the memory modules 25, 26, respectively. The memory subsystem 14 therefore operates under a three clock domain, i.e., a read clock domain governed by the read clock RCLK, a write clock domain governed by the write clock WCLK, and a command clock domain governed by the command clock CCLK. In a two clock domain, the third clock domain CCLK does not exist and the write cock WCLK serves the dual purpose of write data capture and command/address capture.

Figure 2:
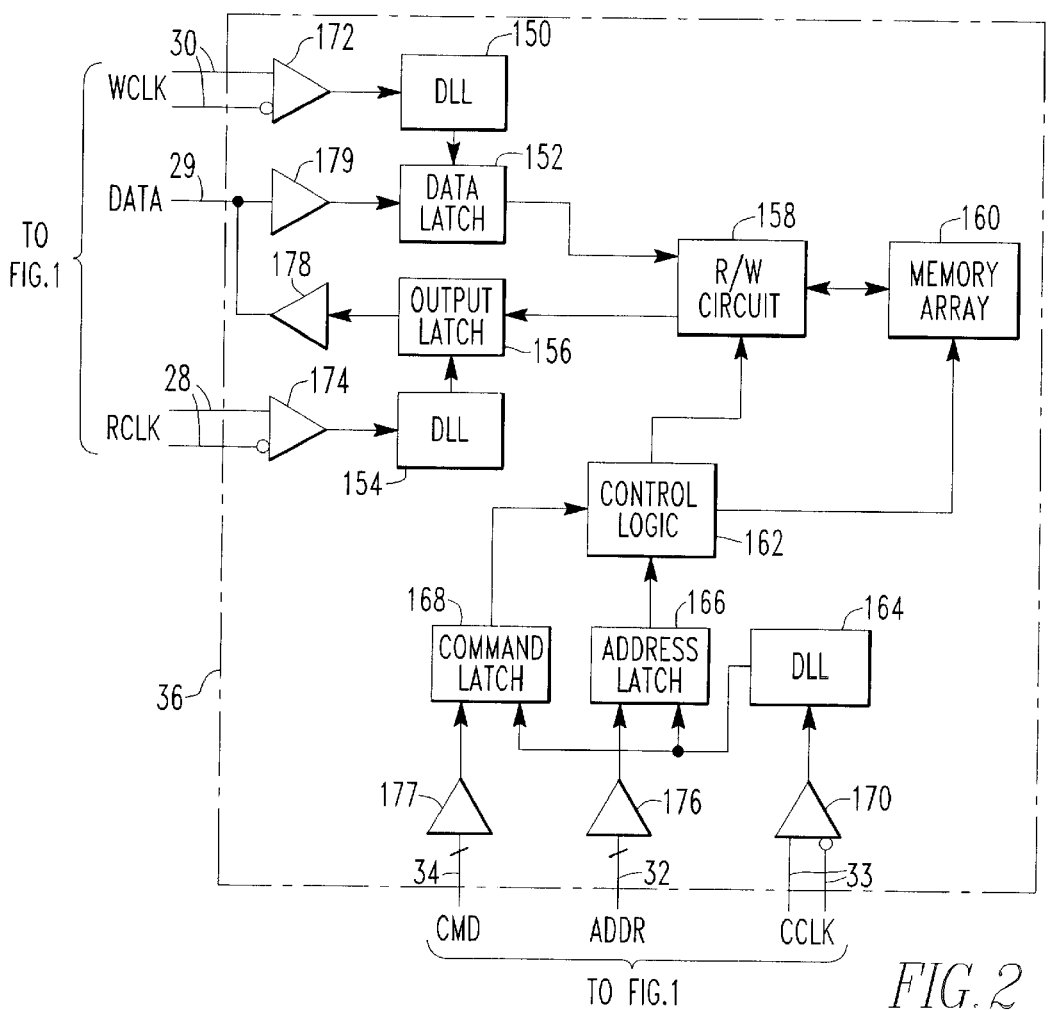
FIG. 2 is a block diagram of a DRAM of FIG. 1 which may use the latch/register of the present invention.

FIG. 2 illustrates one of the memory devices 36 illustrated in FIG. 1. The memory device 36 is representative of the other memory devices 37–39 and 36'–39'. A delay locked loop 150 is responsive to the write clock WCLK, and its complement, provided by a receiver 172, to produce clock signals input to a data latch 152. A delay locked loop 154 is responsive to the read clock signal RCLK, and its complement, provided by a receiver 174, for producing clock signals input to an output latch 156. The data latch 152 receives data from data line 29 through a receiver 179 while the output latch 156 places data on data line 29 through a transmitter 178.

Data from the data latch 152 is input to a read/write control circuit 158 which is responsible for writing the data into a memory array 160 under the control of control logic 162. The read/write control circuit 158 is also responsible for reading data out of memory array 160, under the control of control logic 162, and forwarding that information to the output latch 156.

A delay locked loop 164 receives the command clock signal CCLK and the complement of the command clock signal through a receiver 170. The delay locked loop 164 outputs clock signals to an address latch 166 and a command latch 168 which are responsive to the address lines 32 and command lines 34 through receivers 176, 177, respectively. The address latch 166 and the command latch 168 provide address and command information, respectively, to the control logic 162. The data latch 152, output latch 156, command latch 168, and address latch 166 may all be implemented with the latch/register of the present invention.

Figure 6:
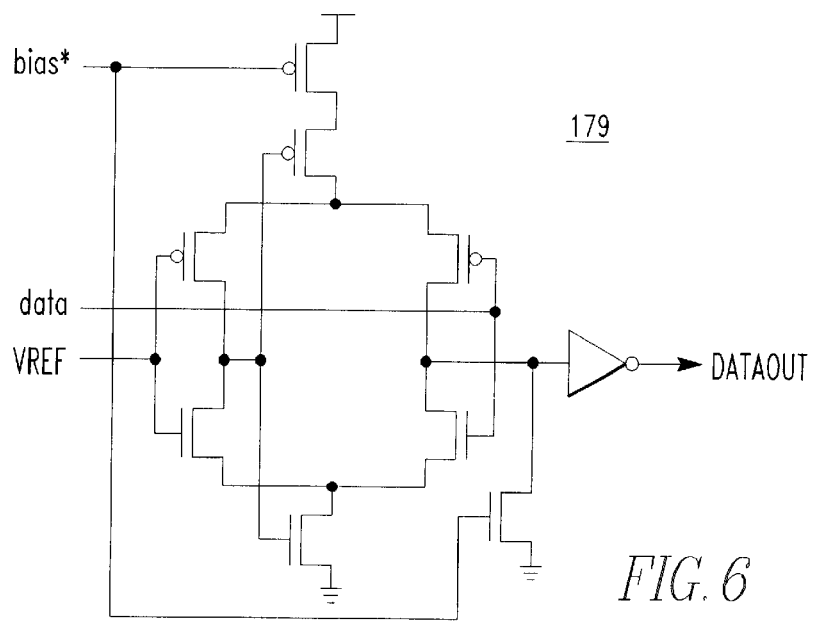
FIG. 6 is a diagram of the receiver of FIG. 2.

Turning briefly to FIG. 6, an example of a data receiver 179 is illustrated. The receiver 179 is representative of the other receivers illustrated in FIG. 2. However, because the details of the receiver 179 do not form an important feature of the present invention, and because the present invention may be used in conjunction with other types of receiver circuits, the receiver 179 illustrated in FIG. 6 is not further described.

The reader will understand that the DRAM 36 shown in FIG. 2 is shown for purposes of illustration and not limitation and that the latch/register of the present invention can be used with other types of memory devices, other types of circuits, and other types of high speed buses.

Figure 3:
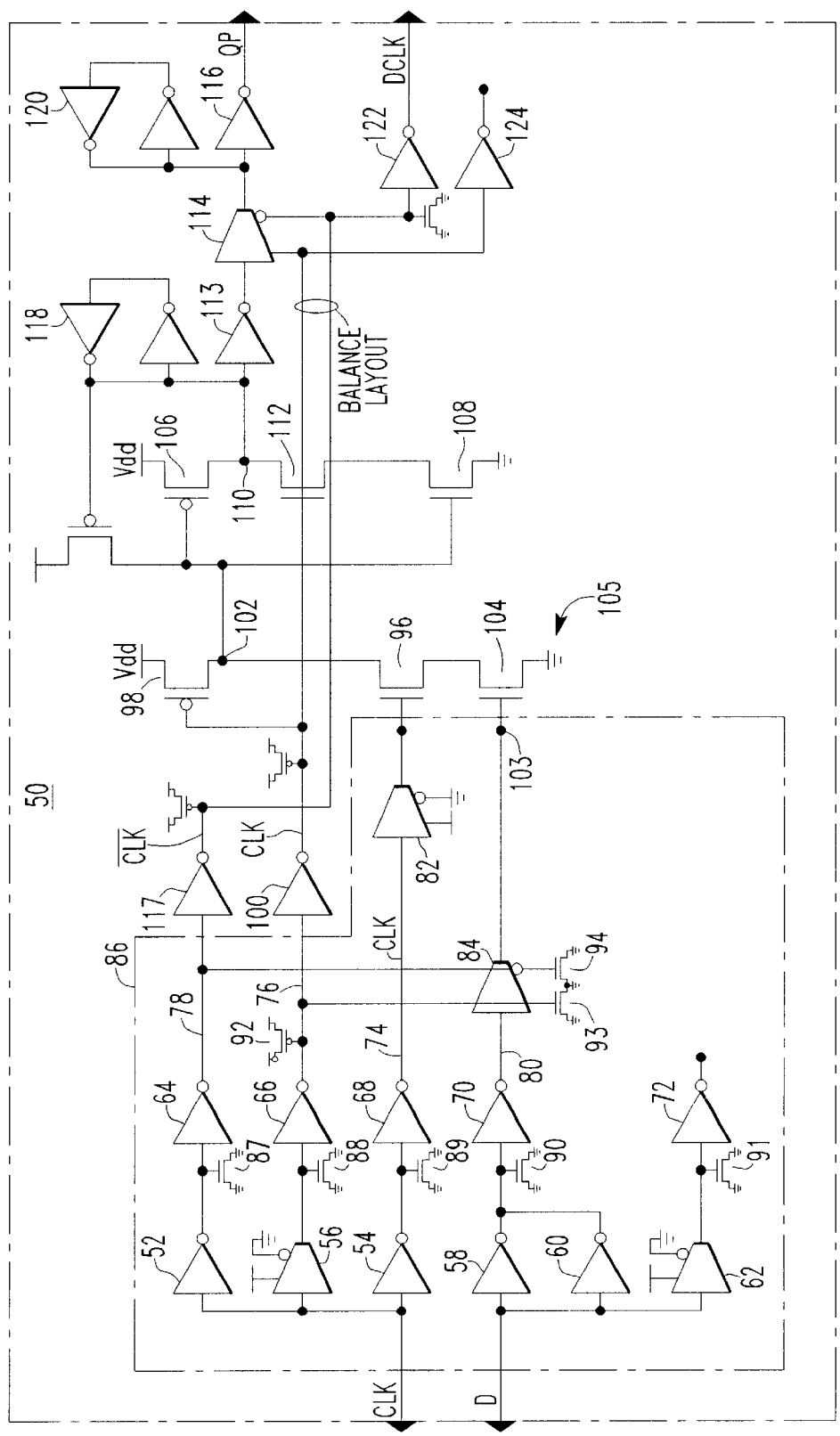
FIG. 3 is a diagram of a latch constructed according to the teachings of the present invention which may be used in the memory device of FIG. 2.

FIG. 3 is an electrical schematic of one embodiment of a circuit, more specifically a latch 50, constructed according to the teachings of the present invention which may be used as the command latch 168 of FIG. 2. The latch 50 has a clock pin CLK, from which the clock signal is input to a first inverter 52, a second inverter 54, and a multiplexer 56. The latch 50 also has a data input pin D at which data signals are input. The data signals are input from the pin D to a first inverter 58, a second inverter 60, and multiplexer 62. Each of the devices, 52, 54, 56, 58, 60, 62 drives an inverter. More specifically, the inverter 52 drives an inverter 64; the multiplexer 56 drives an inverter 66; the inverter 54 drives an inverter 68; the inverters 58 and 60 drive an inverter 70; and the multiplexer 62 drives an inverter 72. In that manner, inverters 54 and 68 provide a first-clock signal path 74, multiplexer 56 and inverter 66 provide a second clock signal path 76 and inverter 52 and the inverter 64 provide a third clock signal path 78. The clock signal paths 74 and 78 carry the clock signal while the clock signal path 76 carries the inverse of the clock signal. The first clock signal path 74 provides the clock signal to a multiplexer 82 which is always conductive. Inverters 58, 60 and 70 provide a data path 80. The data path 80 provides the data to a multiplexer 84. The second clock signal path 76 provides the inverse of the clock signal to the multiplexer 84 while the third clock signal path 78 provides clock signals to the multiplexer 84. The previously described components constitute an input circuit or input stage 86.

The input circuit 86 should be constructed to have a minimal number of interconnects and so that similar paths match one another. Furthermore, transistors 87–94 are provided so that the amount of capacitance provided by p-mos transistors is equal to the amount of capacitance provided by n-mos transistors which are used to construct the inverters and multiplexers. The number, location, and type of transistors 87–94 will vary depending on circuit design and fabrication processes employed. The purpose of adding transistors 87–94 is so the loading seen by the clock signal is the same as the loading seen by the data signal.

The multiplexer 82 outputs the clock signal CLK to a gate of an n-mos switching transistor 96. The switching transistor 96 turns on in response to the rising edge of the clock signal and turns off in response to the falling edge of the clock signal.

A p-mos charging transistor 98 is responsive to the clock signal CLK which is received from the second clock path 76 through an inverter 100 to charge a node 102 whenever the clock signal is low.

As noted, the multiplexer 84 is responsive to the clock and inverse clock signals available on paths 78 and 76, respectively. During a setup time, the multiplexer 84 allows charge to be collected at a node 103. After the setup time, the multiplexer 84 isolates the node 103 from the data path 80. The charge accumulated at the node 103 during the setup time is applied to the gate of an n-mos sampling transistor 104. The sampling transistor 104 has one terminal connected in series through the switching transistor 96 to the node 102 and another terminal connected to a predetermined voltage such as ground. The sampling transistor 104 is a small transistor sized such that the gate capacitance is on the order of 1.5 femtofarads. By minimizing the gate capacitance, the charge needed to turn the transistor 104 on is minimized, which is consistent with the short setup time and zero hold time requirements. Multiplexer 84 is one example of a device used to allow charge to accumulate. Examples of other devices include tristate drivers and pass gates.

In operation, while the multiplexer 84 is allowing charge to accumulate during the setup time, the clock signal is low such that switching transistor 96 is off, transistor 98 is on, and node 102 is charged to a predetermined voltage, such as a system voltage Vdd. When the clock signal goes high, the multiplexer 84 isolates node 103 from the data path 80 and the accumulated charge continues to be available at the gate terminal of the sampling transistor 104. Switching transistor 96 is rendered conductive by the rising edge of the clock signal. If the charge applied to the gate terminal of the sampling transistor 104 is sufficient, the sampling transistor 104 will become conductive and the node 102 discharged to ground thus indicating that a high or "one" has been sampled. Alternatively, if the charge applied to the gate terminal of the sampling transistor 104 is not sufficient to turn the sampling transistor 104 on, the node 102 will not be discharged indicating that low or "zero" has been sampled. The node 102, switching transistor 96, and sampling transistor 104 may be referred to as an evaluation stage or circuit 105. After the evaluation stage 105, the remainder of the components comprise an output circuit or output stage and are used to propagate the sensed state such that a logic "one" or a logic "zero" is available at an output terminal QP of latch 50 as described hereinafter.

The node 102 is connected to a control terminal of a p-mos transistor 106 and a control terminal of an n-mos transistor 108. The p-mos transistor 108 is connected across a predetermined voltage, such as system voltage Vdd, and a node 110 while the n-mos transistor 108 is connected to the node 110 through a transistor 112 and to a predetermined voltage such as ground.

When a zero is sampled, the node 102 stays high thereby turning on the transistor 108. Transistor 108, when conductive, pulls the node 110 to ground in response to the clock signal rendering transistor 112 conductive. When the node 110 is pulled to ground, a zero propagates through a series connected inverter 113, an output multiplexer 114 and an inverter 116 which is connected to the output pin QP. The output multiplexer 114 receives the clock signal from the inverter 100 and the inverse clock signal from an inverter 117.

When a one is sampled, the node 102 is pulled low causing transistor 106 to become conductive such that node 110 is charged to the system voltage Vdd. That voltage, which represents a logic one, propagates through the inverter 113, the output multiplexer 114, and the inverter 116 to the output pin QP.

Two keeper circuits 118 and 120 are connected at the inputs of inverters 113 and 116, respectively. These keeper circuits are latches comprised of inversely connected inverters that provide a weak feedback signal to enable voltages appearing at the input terminals of inverters 113 and 116 to be held. The keeper latches or keeper circuits 118 and 120 are sized so as to hold a signal value, while not having sufficient strength to overwrite a signal value at an input terminal of either of the inverters 113 or 116.

The inverse clock signal is input to an inverter 122 and is output from the latch 50 at a delayed clock pin DCLK. The clock signal CLK is similarly loaded with an inverter 124, but that signal is not output from the latch 50. The layout of the first clock signal path 76 and second clock signal path 78 should be balanced so that the clock signals on those paths see the same loading.

Figure 4:
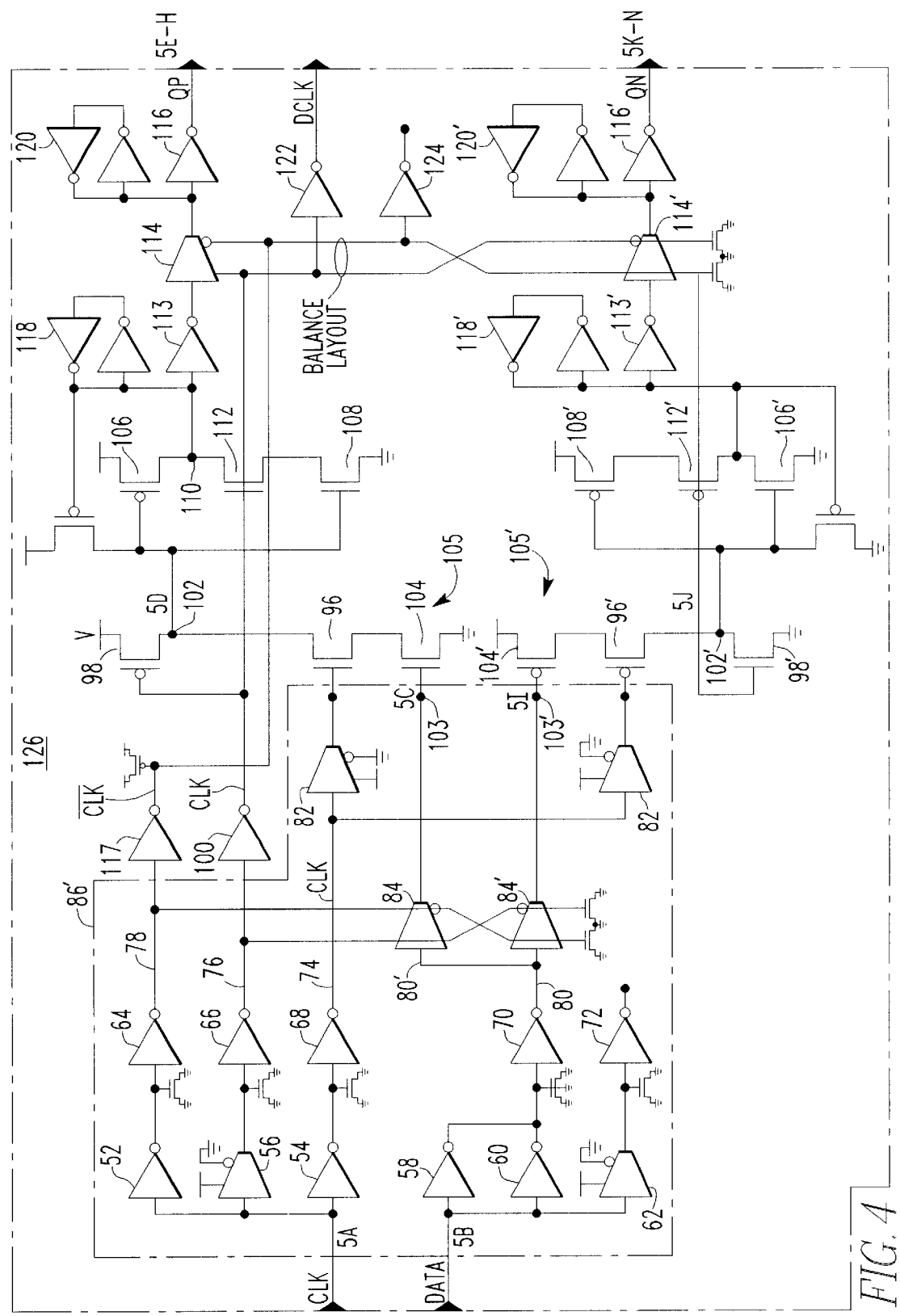
FIG. 4 is a diagram of a register constructed according to the teachings of the present invention which may be used in the memory device of FIG. 2.

FIG. 4 is an electrical schematic of one embodiment of a circuit, more specifically a data register 126, constructed according to the teachings of the present invention which may be used as the data latch 152 of FIG. 2. The register 126 is similar in construction and operation to the latch 50 illustrated in FIG. 3. Accordingly, components performing identical functions carry the same reference numeral.

One of the primary differences between the register 126 of FIG. 4 and the latch 50 of FIG. 3 is the manner in which the output multiplexers 114 and 114' are operated in the register 126. The control terminal connections on the output multiplexer 114' of register 126 are opposite of those of the output multiplexer 114 of the latch 50 such that the output multiplexer 114' is not opened until the data is valid. Another difference between the register of FIG. 4 and the latch 50 of FIG. 3 is that the register samples the data on both the rising and falling edges of the clock signal whereas the latch 50 of FIG. 3 only samples the data on the rising edge of the clock signal. As a result, the input stage 86' of the register 126 has two data paths, 80 and 80', connected to two multiplexers 84 and 84', respectively. The first clock signal path 74 provides the first clock signal to two multiplexers, 84 and 84'.

The sampling stage 105 has a switching transistor 96 and a sampling transistor 104 responsive to multiplexers 82 and 84, respectively. The input stage 86' and sampling circuit 105 operate as previously discussed so that data signals are available at an output terminal QP of the register 126.

Another sampling stage 105' is provided which is constructed in a manner similar to the sampling stage 105, except that where the sampling stage 105 has an n-mos transistor, the sampling stage 105' has a p-mos transistor, and where the sampling stage 105 has a p-mos transistor, the sampling stage 105' has an n-mos transistor. The remainder of the circuit which is responsive to node 102' similarly uses n-mos transistors and p-mos transistors in an opposite manner. In that manner, the switching transistor 96' and sampling transistor 104' can produce a voltage at node 102' which is ultimately made available at an output terminal QN of the data register 126. Because of the interchanging of p-mos and n-mos transistors, the upper portion of the circuit shown in FIG. 4 produces a voltage representation of the data signal at node 102 on the rising edge of the clock signal whereas the lower portion of the circuit produces at node 102' a voltage representative of the data signal on the falling edge of the clock signal.

FIGS. 5A–5N are signal traces which help to explain the operation of the register 126 of FIG. 4. FIG. 5A illustrates the clock signal. FIG. 5B illustrates four different data signals, two of which lead the falling edge of the clock signal, one of which is timed with the falling edge of the clock signal, and one which lags the falling edge of the clock signal. The voltage at node 103 is illustrated in FIG. 5C for each of the four cases, while the voltage at the node 102 is illustrated in FIG. 5D for the four cases. The resulting data signals available at the output terminal QP for the four different cases are illustrated in FIGS. 5E–5H. As seen, where the data signals lead or are in phase with the clock signal, the data pulse was correctly sampled. However, for the data pulse which lags the clock signal, the data pulse was improperly sampled as shown in trace 5H.

FIG. 5I illustrates the voltage available at the node 103' while FIG. 5J illustrates the voltage available at the node 102'. FIGS. 5K–5N illustrate the data signal available at the output terminal QN in each of the four cases. As seen, for the data signals which lead or are in phase with the clock signal, the data signal was properly sampled. However, for the data signal which lagged the clock signal, the data signal was improperly sampled as shown in trace 5N.

While the present invention has been described in connection with exemplary embodiments thereof, those of ordinary skill in the art will recognize that many modifications and variations are possible. Such modifications and variations are intended to be within the scope of the present invention, which is limited only by the following claims.

What is claimed is:

1. A circuit having a data input pin for receiving a data signal and a clock input pin for receiving a clock signal, said circuit comprising:

an input stage for periodically connecting the data input pin to a sampling device in response to the clock signal;

an evaluation stage including said sampling device and responsive to said clock signal, for evaluating charge collected by said sampling device at a time said sampling device is disconnected from the data input pin, said evaluation stage for producing a signal representative of the sampled charge; and an output stage, responsive to said clock signal and said signal representative of said sampled charge, for outputting a data signal.

2. The circuit of claim 1 wherein said input stage includes an inverter for producing the complement of the clock signal, and wherein said sampling device is connected to said data input pin through a multiplexer responsive to said clock signal and the complement of the clock signal.

3. The circuit of claim 1 wherein said input stage includes multiple clock signal paths responsive to said clock input pin and a data path responsive to said data input pin, said clock input pin and said data input pin having substantially the same loading.

4. The circuit of claim 1 wherein said evaluation stage includes a switching transistor responsive to the clock signal and said sampling device includes a sampling transistor, said sampling transistor and said switching transistor connected in series between a node and a predetermined voltage, said signal representative of the sampled charge being available at said node.

5. The circuit of claim 4 wherein said sampling transistor has a gate capacitance on the order of 1.5 femtofarads.

6. The circuit of claim 1 wherein said output stage includes an output multiplexer for outputting the data signal, said multiplexer responsive to said clock signal so as to cause said circuit to operate as one of a latch and register.

7. The circuit of claim 1 wherein said output stage outputs the data signal in response to one of a rising edge and a falling edge of the clock signal.

8. A circuit having a data input pin for receiving a data signal and a clock input pin for receiving a clock signal, said circuit comprising:

an input stage for periodically connecting the data input pin to a plurality of sampling devices in response to the clock signal;

an evaluation stage including said plurality of sampling devices and responsive to said clock signal, for evaluating charge collected by said plurality of sampling devices at a time said sampling devices are disconnected from the data input pin, said evaluation stage for producing a plurality of signals representative of the sampled charges; and an output stage, responsive to said clock signal and said signals representative of said sampled charges, for outputting data signals.

9. The circuit of claim 8 wherein said input stage includes an inverter for producing the complement of the clock signal, and wherein said sampling devices are each connected to said data input pin through one of a plurality of multiplexers each responsive to said clock signal and the complement of the clock signal.

10. The circuit of claim 8 wherein said input stage includes multiple clock signal paths responsive to said clock input pin and a plurality of data paths responsive to said data input pin, said clock input pin and said data input pin having substantially the same loading.

11. The circuit of claim 8 wherein said evaluation stage includes a plurality of switching transistors each responsive to the clock signal and said sampling devices includes a plurality of sampling transistors, one each of said sampling transistors and said switching transistors connected in series between one of a plurality of nodes and a predetermined voltage, said signals representative of the sampled charges being available at said nodes.

12. The circuit of claim 11 wherein said sampling transistors have a gate capacitance on the order of 1.5 femtofarads.

13. The circuit of claim 8 wherein said output stage includes a plurality of output multiplexers for outputting the data signals, said multiplexers responsive to said clock signal so as to cause said circuit to operate as one of a latch and register.

14. The circuit of claim 8 wherein said output stage outputs the data signals in response to a rising edge and a falling edge of the clock signal.

15. A memory device, comprising:

a command circuit for receiving commands;

a data circuit for receiving data;

peripheral circuits for controlling the operation of said command and said data circuits;

an array of memory cells; and a read/write circuit, responsive to said command circuit and said data circuit, for reading data out of and writing data into said array of memory cells; and wherein said command circuit has a data input pin for receiving a data signal and a clock input pin for receiving a clock signal, said command circuit comprising:

an input stage for periodically connecting the data input pin to a sampling device in response to the clock signal;

an evaluation stage including said sampling device and responsive to said clock signal, for evaluating charge collected by said sampling device at a time said sampling device is disconnected from the data input pin, said evaluation stage for producing a signal representative of the sampled charge; and an output stage, responsive to said clock signal and said signal representative of said sampled charge, for outputting a data signal.

16. The memory of claim 15 wherein said input stage includes multiple clock signal paths responsive to said clock input pin and a data path responsive to said data input pin, said clock input pin and said data input pin having substantially the same loading.

17. The memory of claim 15 wherein said evaluation stage includes a switching transistor responsive to the clock signal and said sampling device includes a sampling transistor, said sampling transistor and said switching transistor connected in series between a node and a predetermined voltage, said signal representative of the sampled charge being available at said node.

18. The memory of claim 17 wherein said sampling transistor has a gate capacitance on the order of 1.5 femtofarads.

19. The memory of claim 17 wherein said output stage includes an output multiplexer for outputting the data signal, said multiplexer responsive to said clock signal so as to cause said circuit to operate as one of a latch and register.

20. The memory of claim 17 wherein said output stage outputs the data signal in response to one of a rising edge and a falling edge of the clock signal.

21. A memory device, comprising:

a command circuit for receiving commands;

a data circuit for receiving data;

peripheral circuits for controlling the operation of said command and said data circuits;

an array of memory cells; and a read/write circuit, responsive to said command circuit and said data circuit, for reading data out of and writing data into said array of memory cells; and wherein said data circuit has a data input pin for receiving a data signal and a clock input pin for receiving a clock signal, said data circuit comprising:

an input stage for periodically connecting the data input pin to a plurality of sampling devices in response to the clock signal;

an evaluation stage including said plurality of sampling devices and responsive to said clock signal, for evaluating charge collected by said plurality of sampling devices at a time said sampling devices are disconnected from the data input pin, said evaluation stage for producing a plurality of signals representative of the sampled charges; and an output stage, responsive to said clock signal and said signals representative of said sampled charge, for outputting data signals.

22. The memory of claim 21 wherein said input stage includes multiple clock signal paths responsive to said clock input pin and a plurality of data paths responsive to said data input pin, said clock input pin and said data input pin having substantially the same loading.

23. The memory of claim 21 wherein said evaluation stage includes a plurality of switching transistors each responsive to the clock signal and said sampling devices includes a plurality of sampling transistors, one each of said sampling transistors and said switching transistors connected in series between one of a plurality of nodes and a predetermined voltage, said signals representative of the sampled charges being available at said nodes.

24. The memory of claim 23 wherein said sampling transistors have a gate capacitance on the order of 1.5 femtofarads.

25. The memory of claim 23 wherein said output stage includes a plurality of output multiplexers for outputting the data signals, said multiplexers responsive to said clock signal so as to cause said circuit to operate as one of a latch and register.

26. The memory of claim 21 wherein said output stage outputs the data signals in response to a rising edge and a falling edge of the clock signal.

27. A system comprising:

a processor;

a memory controller responsive to said processor;

a first bus interconnecting said processor and said memory controller;

a plurality of memory devices; and a second bus interconnecting said memory controller and said plurality of memory devices, each memory device comprising:

a command circuit for receiving commands;

a data circuit for receiving data;

peripheral circuits for controlling the operation of said command and said data circuits;

an array of memory cells; and a read/write circuit, responsive to said command circuit and said data circuit, for reading data out of and writing data into said array of memory cells; and wherein said command circuit has a data input pin for receiving a data signal and a clock input pin for receiving a clock signal, said command circuit comprising:

an input stage for periodically connecting the data input pin to a sampling device in response to the clock signal;

an evaluation stage including said sampling device and responsive to said clock signal, for evaluating charge collected by said sampling device at a time said sampling device is disconnected from the data input pin, said evaluation stage for producing a signal representative of the sampled charge; and an output stage, responsive to said clock signal and said signal representative of said sampled charge, for outputting a data signal.

28. The system of claim 27 wherein said input stage includes multiple clock signal paths responsive to said clock input pin and a data path responsive to said data input pin, said clock input pin and said data input pin having substantially the same loading.

29. The system of claim 27 wherein said evaluation stage includes a switching transistor responsive to the clock signal and said sampling device includes a sampling transistor, said sampling transistor and said switching transistor connected in series between a node and a predetermined voltage, said signal representative of the sampled charge being available at said node.

30. The system of claim 29 wherein said sampling transistor has a gate capacitance on the order of 1.5 femtofarads.

31. The system of claim 27 wherein said output stage includes an output multiplexer for outputting the data signal, said multiplexer responsive to said clock signal so as to cause said circuit to operate as one of a latch and register.

32. The system of claim 27 wherein said output stage outputs the data signal in response to one of a rising edge and a falling edge of the clock signal.

33. A system, comprising:
 a processor;
 a memory controller responsive to said processor;
 a first bus connecting said processor and said memory controller;
 a plurality of memory devices; and
 a second bus interconnecting said memory controller and said plurality of memory devices, each memory device comprising:
  a command circuit for receiving commands;
  a data circuit for receiving data;
  peripheral circuits for controlling the operation of said command and said data circuits;
  an array of memory cells; and
  a read/write circuit, responsive to said command circuit and said data circuit, for reading data out of and writing data into said array of memory cells; and wherein said data circuit has a data input pin for receiving a data signal and a clock input pin for receiving a clock signal, said data circuit comprising:
   an input stage for periodically connecting the data input pin to a plurality of sampling devices in response to the clock signal;
   an evaluation stage including said plurality of sampling devices and responsive to said clock signal, for evaluating charge collected by said plurality of sampling devices at a time sampling devices are disconnected from the data input pin, said evaluation stage for producing a plurality of signals representative of the sampled charges; and
   an output stage, responsive to said clock signal and said signals representative of said sampled charges, for outputting data signals.

34. The system of claim 33 wherein said input stage includes multiple clock signal paths responsive to said clock input pin and a plurality of data paths responsive to said data input pin, said clock input pin and said data input pin having substantially the same loading.

35. The system of claim 33 wherein said evaluation stage includes a plurality of switching transistors each responsive to the clock signal and said sampling devices includes a plurality of sampling transistors, one each of said sampling transistors and said switching transistors connected in series between one of a plurality of nodes and a predetermined voltage, said signals representative of the sampled charges being available at said nodes.

36. The system of claim 35 wherein said sampling transistors have a gate capacitance on the order of 1.5 femtofarads.

37. The system of claim 33 wherein said output stage includes a plurality of output multiplexers for outputting the data signals, said multiplexers responsive to said clock signal so as to cause said circuit to operate as one of a latch and register.

38. The system of claim 33 wherein said output stage outputs the data signals in response to a rising edge and a falling edge of the clock signal.

* * * * *

UNITED STATES PATENT AND TRADEMARK OFFICE
CERTIFICATE OF CORRECTION

PATENT NO. : 6,522,172 B2  
DATED : February 18, 2003  
INVENTOR(S) : Keeth et al.

It is certified that error appears in the above-identified patent and that said Letters Patent is hereby corrected as shown below:

Column 1,  
Line 50, delete "exits" and insert therefor -- exists --.

Column 3,  
Line 64, delete "cock" and insert therefor -- clock --.

Signed and Sealed this

Ninth Day of September, 2003

JAMES E. ROGAN  
*Director of the United States Patent and Trademark Office*